(12) United States Patent
Pedersen et al.

(10) Patent No.: US 7,757,189 B1
(45) Date of Patent: Jul. 13, 2010

(54) SUPER DUPLICATE REGISTER REMOVAL

(75) Inventors: Bruce Pedersen, Sunnyvale, CA (US); Greg William Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 464 days.

(21) Appl. No.: 11/489,013

(22) Filed: Jul. 18, 2006

Related U.S. Application Data

(60) Provisional application No. 60/720,343, filed on Sep. 23, 2005.

(51) Int. Cl.
*G06F 17/50* (2006.01)
(52) U.S. Cl. .............................................. 716/5; 716/4
(58) Field of Classification Search .................. 716/3–6
See application file for complete search history.

(56) References Cited

U.S. PATENT DOCUMENTS

| | | | |
|---|---|---|---|
| 5,796,624 A * | 8/1998 | Sridhar et al. .................. | 703/14 |
| 6,026,222 A * | 2/2000 | Gupta et al. .................... | 716/5 |
| 6,651,223 B2 * | 11/2003 | Yamashita et al. ............. | 716/1 |
| 7,003,743 B2 * | 2/2006 | Abadir et al. ................... | 716/4 |
| 2002/0049955 A1 * | 4/2002 | Yamashita et al. ............. | 716/1 |
| 2003/0061576 A1 * | 3/2003 | Saluja et al. .................... | 716/2 |
| 2003/0149945 A1 * | 8/2003 | Abadir et al. ................... | 716/3 |

\* cited by examiner

*Primary Examiner*—Jack Chiang
*Assistant Examiner*—Binh C Tat
(74) *Attorney, Agent, or Firm*—Townsend and Townsend and Crew LLP

(57) ABSTRACT

Redundant elements of digital designs, including digital designs with registered feedback, are identified and removed. The nodes of a design are assigned initial labels. The design is analyzed by selecting nodes associated with each label and identifying any equivalent nodes or complementary nodes to the selected node. Nodes are equivalent if they perform the same or complementary functions on input nodes assigned to the same labels. The selected node and its equivalent node, if any, are reassigned to the same label. Two or more complementary nodes are modified so that they have the same output. This analysis is repeated until all of the labels and associated nodes have been analyzed and there are no labels and associated nodes in need of further analysis. Following this analysis, equivalent nodes in the digital design will share the same label and all but one node with each label can be removed.

21 Claims, 17 Drawing Sheets

1105

1110

SUPER DUPLICATE REGISTER REMOVAL

BACKGROUND OF THE INVENTION

This invention relates to the field of software for designing digital circuits, and specifically to systems and method for optimizing digital circuit designs. Designers of digital circuits often use Electronic Design Automation (EDA) software to create digital circuit designs. The EDA software then processes or compiles the digital circuit design to create data that specifies an implementation of the digital design in hardware. This data can include mask layout and other semiconductor processing parameters for implementing the digital design in an integrated circuit. This data may alternately specify data that implements the digital design in a programmable device, such as a programmable logic device (PLD), field programmable gate array (FPGA), or structured or unstructured ASIC.

Typically, digital circuits are described by designers as a network of combinational logic elements, registers, and hierarchical blocks or cells of lower-level circuits. It is often the case that these networks contain redundant elements. For example, redundant elements might be introduced when designers create multiple instances of the same hierarchical cell. It may be the case that two of more instances of a hierarchical cell could share all or a portion of their lower-level circuit. Redundant elements can also be introduced to a digital design through mistakes or carelessness. Redundant elements increase the area or amount of resources needed to implement the digital design and the power consumed by the digital design. Redundant elements can also decrease the speed of the digital design.

Previous techniques of removing redundant logic have focused on identifying equivalent combinational logic using structural and Boolean techniques. For example, structural techniques consider two logic gates to be equivalent if they are fed by the same gates or primary inputs, including potentially ignoring the input order for those gates whose function are independent of the input ordering, such as OR, AND, or XOR gates. Boolean techniques convert all or a subset of the combinational gates in the digital design to a canonical format, such as a Binary Decision Diagram (BDD), which is used to identify equivalent subsets of combinatorial gates. Registers are considered equivalent if the logic feeding their corresponding inputs are the same, otherwise they are treated as primary inputs.

When two or more nodes are identified as equivalent, all but one of the equivalent nodes can be removed from the digital design. The destinations fed by the removed nodes are modified to be fed by the remaining equivalent node. These techniques can be iterated over the modified digital design until no more equivalent nodes are identified.

However, these prior techniques are not capable of identifying equivalent registers in complex netlists in which registers feed back on one another. An example of registered feedback is when the output of a register is provided as an input to combinatorial logic connected with the input of the register. Registered feedback is very common in digital circuits.

It is therefore desirable for a system and method to identify and remove redundant elements of a digital design. It is further desirable for the system and method to be capable of identifying and removing redundant elements in a digital design even in the presence of registered feedback.

BRIEF SUMMARY OF THE INVENTION

An embodiment of the invention identifies redundant elements of a digital designs, including digital designs with registered feedback. The nodes of a design are assigned initial labels. The design is analyzed by selecting nodes associated with a label and identifying any equivalent nodes or complementary nodes to the selected node. The selected node and its equivalent node, if any, are reassigned to the same label. Two or more complementary nodes are modified so that they have the same output. This analysis is repeated until all of the labels and associated nodes have been analyzed and there are no labels and associated nodes in need of further analysis. Following this analysis, equivalent nodes in the digital design will share the same label and all but one node with each label can be removed.

In an embodiment, a method of identifying redundant elements of a digital design comprises assigning labels to nodes of a digital design; selecting at least one label; identifying a first node of the digital design assigned to the selected label; identifying at least one additional node of the digital design assigned to the selected label; identifying at least one equivalent node of the digital design, wherein the equivalent node is logically equivalent to the additional node; determining if the equivalent node is the same as the first node; reassigning labels of at least the additional node in response to a determination that the equivalent node is not the same as the first node; determining if the additional node and the equivalent node are complements; and modifying at least the additional node or the equivalent node in response to a determination that the additional node and the equivalent node are complements.

In an embodiment, nodes are considered equivalent if they perform the same or complementary functions on one or more input nodes assigned to the same labels.

In a further embodiment, reassigning labels of at least the additional node further comprises determining if the equivalent node is the same as the additional node; assigning the label associated with the equivalent node to the additional node in response to a determination that the equivalent node is not the same as the additional node; and assigning an unused label to the additional node in response to a determination that the equivalent node is the same as the additional node.

BRIEF DESCRIPTION OF THE DRAWINGS

The invention will be described with reference to the drawings, in which.

DETAILED DESCRIPTION OF THE INVENTION

Figure 1:
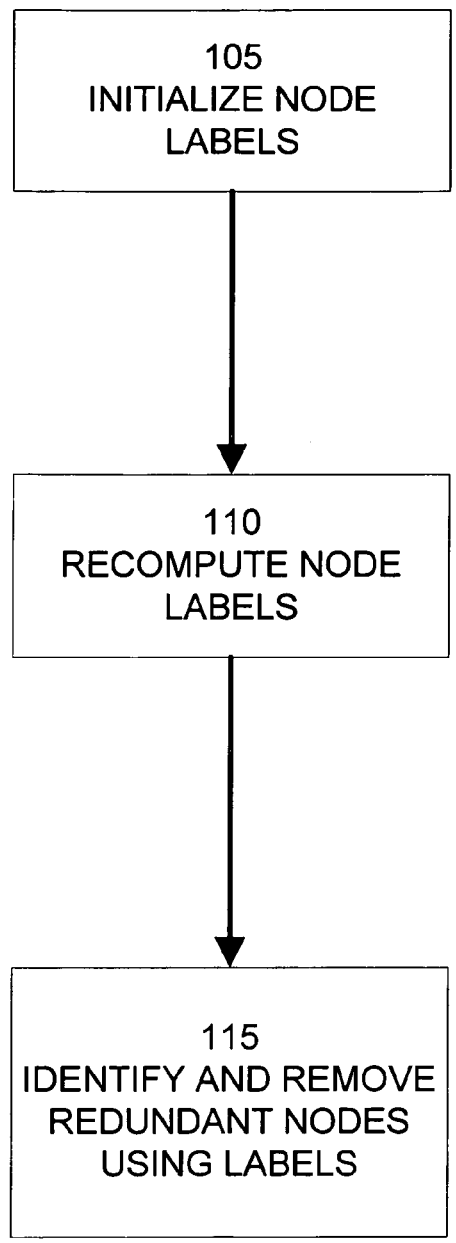
FIG. 1 illustrates phases of a method of identifying and removing redundant elements of a digital design according to an embodiment of the invention.

FIG. 1 illustrates phases of a method of identifying and removing redundant elements of a digital design according to an embodiment of the invention. In an embodiment, the method includes a first phase 105, a second phase 110, and a third phase 115. In this first phase 105, nodes of the netlist of the digital design are assigned initial labels. Phase 110 evaluates nodes for equivalency and assigns the same label to equivalent nodes. Phase 115 locates and removes redundant elements from the netlist by identifying nodes with the same label. In an embodiment, phase 115 removes all but one of the nodes with the same label and reconnects the appropriate portions of the netlist with the remaining node.

Figure 2:
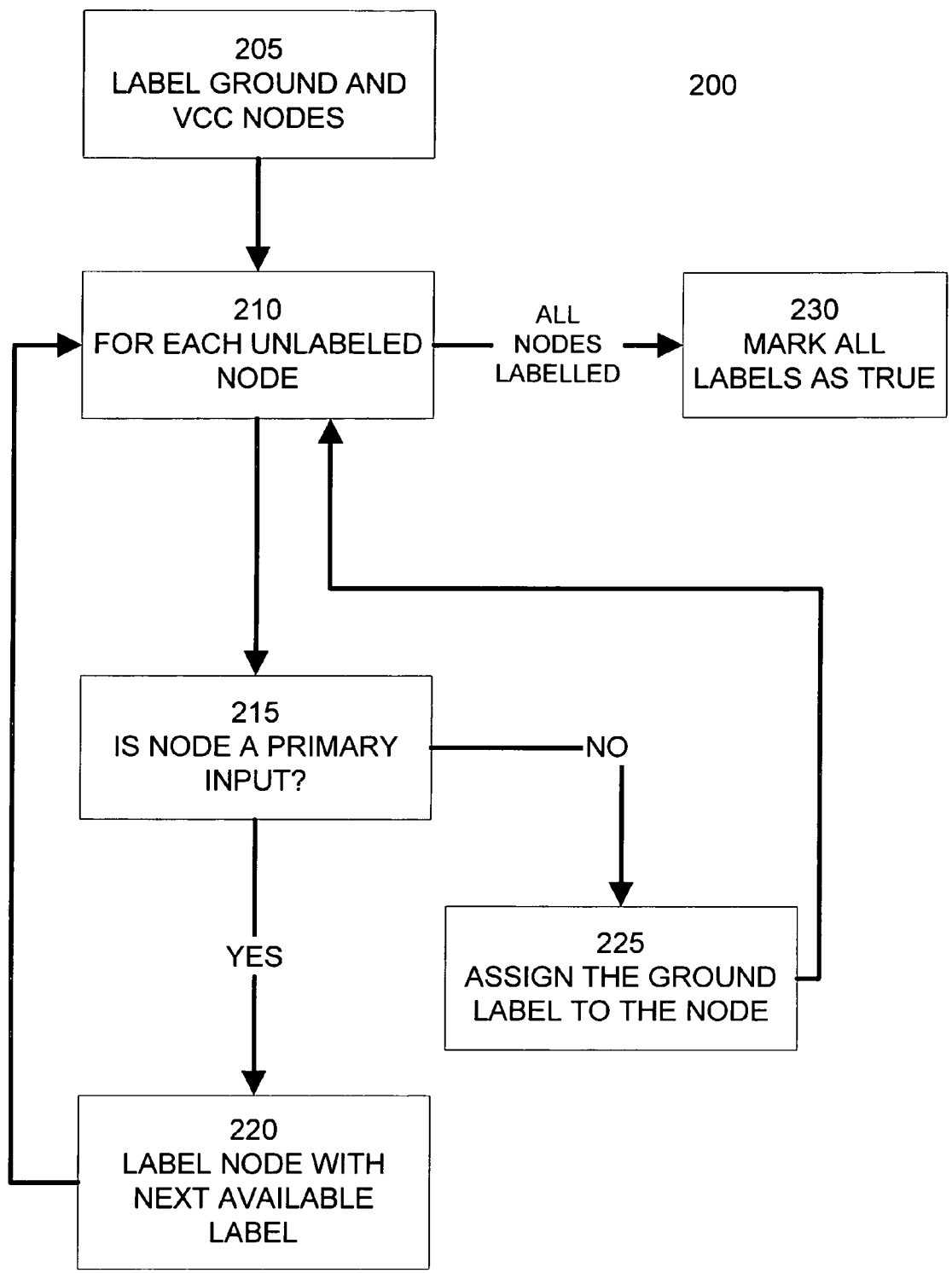
FIG. 2 illustrates a first phase of a method of identifying and removing redundant elements of a digital design according to an embodiment of the invention.

FIG. 2 illustrates a first phase 200 of a method of identifying and removing redundant elements of a digital design according to an embodiment of the invention. Phase 200 assigns initial labels to the nodes of the netlist. In an embodiment, numerical labels are assigned to nodes in the netlist. A label count variable tracks the number of labels currently in use by the netlist and provides the name of the next unused label. In alternate embodiments, labels can include any combination of alphanumeric characters or other types of identifying information and can be assigned in any systematic or arbitrary manner that is consistent with the phases described below.

Step 205 receives a netlist for analysis and assigns labels to ground and VCC nodes of the netlist. In an embodiment, ground nodes are assigned a label of "0" and VCC nodes are assigned a label of "1." Following the assignment of labels to the ground and VCC nodes of the netlist, the label count variable is set to "2." In this embodiment, the value of the label count variable, "2," is also the name of the next unused label.

Step 210 selects one of the unlabelled nodes of the netlist. Step 210 determines if the selected node is a primary input. A primary input is a node that is not fed or dependent upon any other logic in the netlist being analyzed. If the selected node is a primary input, step 220 labels the selected node with the next unused label. As discussed above, in an embodiment, the next unused label is the value of the label count variable. In this embodiment, following the assignment of the value of the label count variable as the name of the selected node, step 220 then increments the label count variable by one, thereby providing the name of the next unused variable.

Conversely, if step 215 determines that the selected node is not a primary input, then step 225 assigns the selected node the same label as that assigned to ground nodes. In an embodiment, if ground nodes are assigned a label of "0," then step 225 will assign the label of "0" to selected nodes that are not primary inputs as well.

Following step 220 or step 225, phase 200 returns to step 210 to select another unlabelled node in the netlist, which will be labeled in steps 215 to 225 as described above. If there are no more unlabelled nodes in the netlist, phase 200 proceeds from step 210 to step 230. In an embodiment, each label includes a Boolean attribute that can be set as "true" or "false." Step 230 sets these attributes to "true" for all of the labels used by the netlist.

Figure 3:
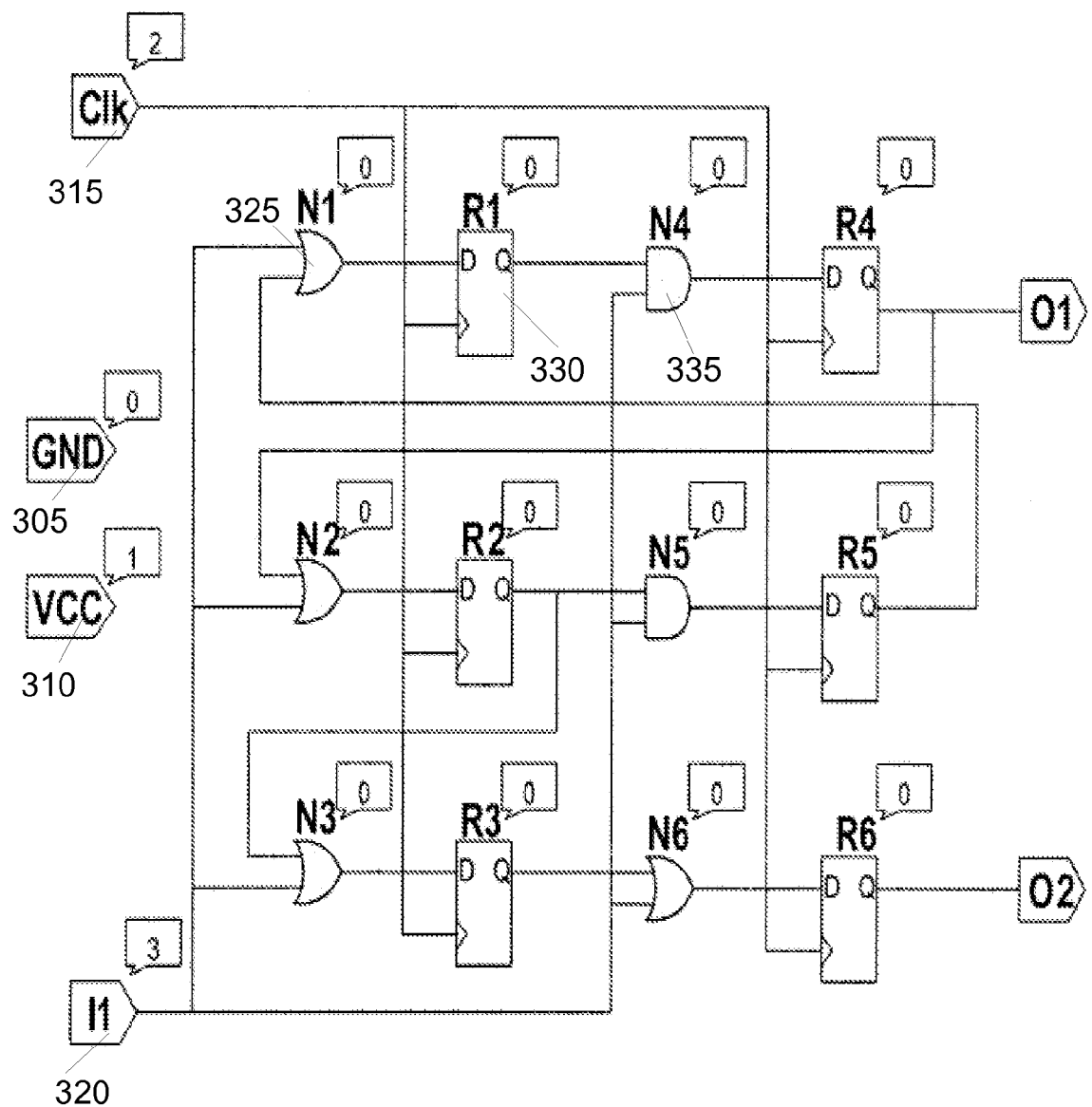
FIG. 3 illustrates an example application of the first phase of a method of identifying and removing redundant elements of a digital design according to an embodiment of the invention.

FIG. 3 illustrates an example application of the first phase of a method of identifying and removing redundant elements of a digital design according to an embodiment of the invention. The nodes of example netlist 300 is labeled as specified in phase 200. For example, ground node 305 and VCC node 310 are assigned labels of "0" and "1," respectively. Nodes that are primary inputs, such as clock input node 315 and data input node 320 are assigned labels of "2" and "3," respectively. Nodes that are not primary inputs, such as OR gate N1, 325, register R1, 330, and AND gate N4, 335, are all assigned a label of "0."

Figure 4:
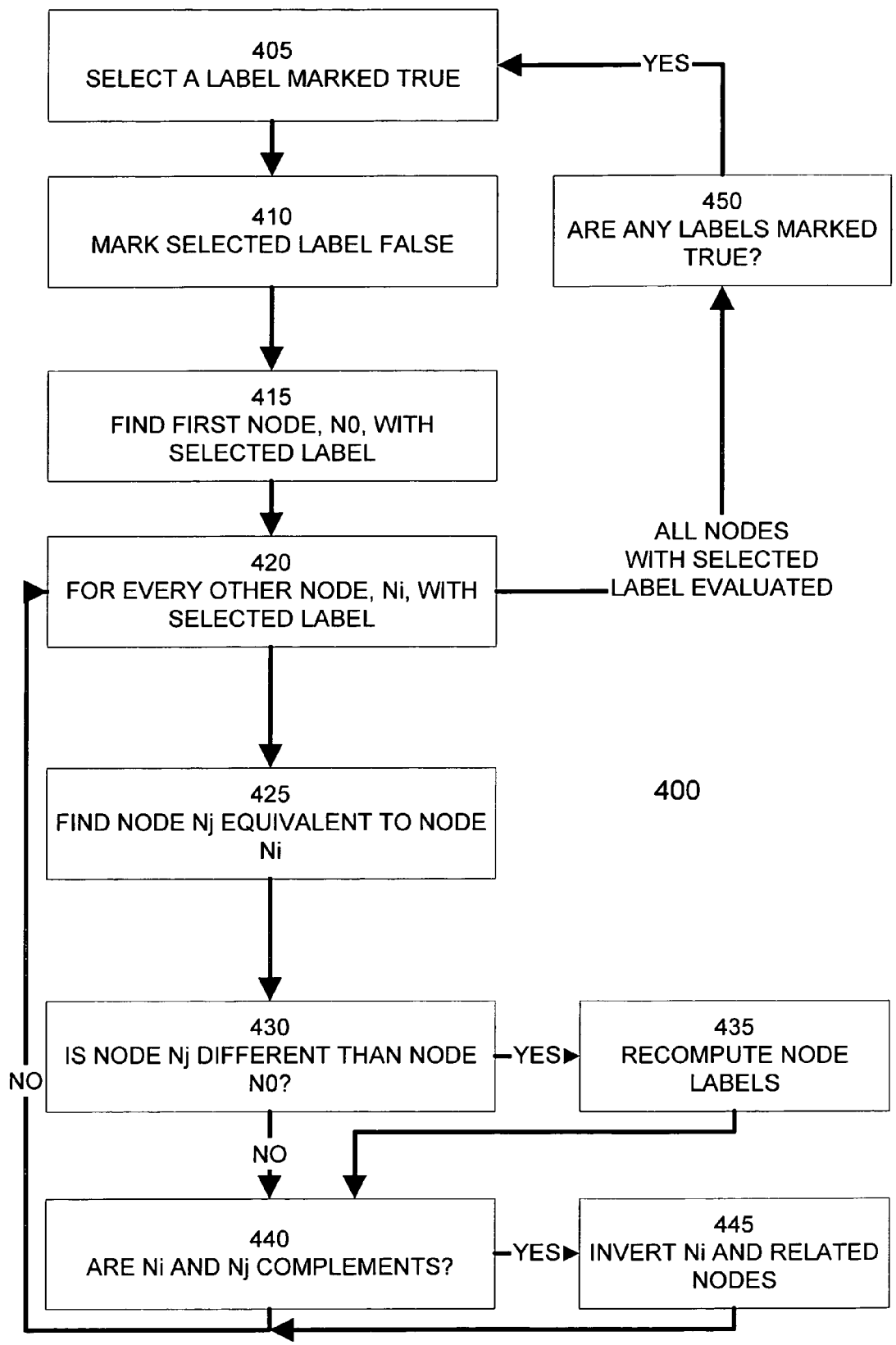
FIG. 4 illustrates a second phase of a method of identifying and removing redundant elements of a digital design according to an embodiment of the invention.

FIG. 4 illustrates a second phase 400 of a method of identifying and removing redundant elements of a digital design according to an embodiment of the invention. Step 405 receives the netlist and the associated labels and selects a label that is marked "true." Step 410 marks the selected label as "false." Step 415 finds a node of the netlist, referred to as N0 in this iteration of phase 400, with the selected label.

Step 420 selects another node in the netlist, referred to as Ni, with the selected label. An embodiment of step 425 searches the entire netlist for any other node, referred to as Nj, that is equivalent to node Ni. It should be noted that this search is not limited to nodes having the same label as node Ni and N0. In an embodiment, two nodes are considered equivalent if they perform the same or complementary functions on input nodes that have the same labels, including potentially ignoring the input order for those nodes whose functions are independent of the input ordering, such as OR, AND, or XOR gates. Two functions are complementary if, given the same inputs, the output of one function is always equal to the Boolean inverse of the other function. Equivalent nodes can be identified using standard logic analysis techniques, including binary decision diagrams (BDD).

A further embodiment of step 425 searches only a portion of the netlist for a node Nj equivalent to node Ni to provide a further reduction in processing time. In this embodiment, step 425 searches for equivalent nodes only within the same hierarchy of nodes as node Ni. For example, if a node Ni selected in step 420 feeds a register R1, this further embodiment of step 425 can limit its search for an equivalent node Nj to the portion of the netlist that also feeds register R1.

Upon finding a node Nj equivalent to node Ni, step 430 determines whether node Nj is a different node than selected node N0. If so, then step 435 recomputes the node labels. In an embodiment, step 435 recomputes node labels as follows. If node Nj is also a different node than node Ni, then step 435 changes the label of node Ni to that of node Nj. If node Nj is the same node as node Ni, then the label of node Ni is changed to the next unused label. In an embodiment, the label of Ni is changed to the next unused label by assigning the value of the label count variable as the name of node Ni. The label count variable is then incremented by one so as to specify the next unused label. In an embodiment, the next unused label that is assigned to node Ni does not have to be marked as "true" unless, as described below, node Ni feeds itself.

In an embodiment, the nodes are evaluated "in order." Thus, node N0 is the "first" node with the selected label, node Ni is the "next" node with the selected label, and node Nj is the "first" node equivalent to node Ni. Thus, in the above embodiment of step 435, node Nj<=node Ni, because the "first" node equivalent to Ni would either be before node Ni or node Ni itself. This order of evaluation ensures that the label associated with node Nj will already have been updated by step 435 when node Ni is being analyzed and updated.

Regardless of whether node Ni is the same node or a different node as node Nj, step 435 additionally identifies every node fed by node Ni. A node is fed by node Ni if any of its inputs depend all or in part on the output of node Ni. Step 435 marks the labels of all of the nodes fed by node Ni to "true."

Following step 430 or 435, step 440 determines if nodes Ni and Nj implement complementary functions. If so, then an embodiment of step 445 inverts node Ni and its related nodes. In an embodiment, this is accomplished by inverting the function of node Ni. Additionally, step 445 identifies every node fed by node Ni. Step 445 inverts any node's inputs connected directly or indirectly with an output of node Ni and marks the label of these nodes fed by node Ni to "true."

Following step 440 or 445, phase 400 returns to step 420 to select another node Ni with the label previously selected in step 405. Additional nodes Ni are processed by steps 420 to 445 as discussed above. If step 420 determines that all of the nodes in the netlist having the selected label have been evaluated, phase 400 proceeds from step 420 to step 450. Step 450 evaluates the labels associated with the netlist to determine if any labels are still marked as "true." If so, then phase 400 returns to step 405 to select another label and its associated nodes for evaluation. Otherwise, phase 400 terminates at step 450.

FIGS. 5A-F illustrate an example application of successive iterations of a method of identifying and removing redundant elements of a digital design according to an embodiment of the invention. In these figures, it can be seen how the labels associated with nodes change over successive iterations of steps 405 to 450 while some labels associated with the netlist are marked "true."

Figure 6:
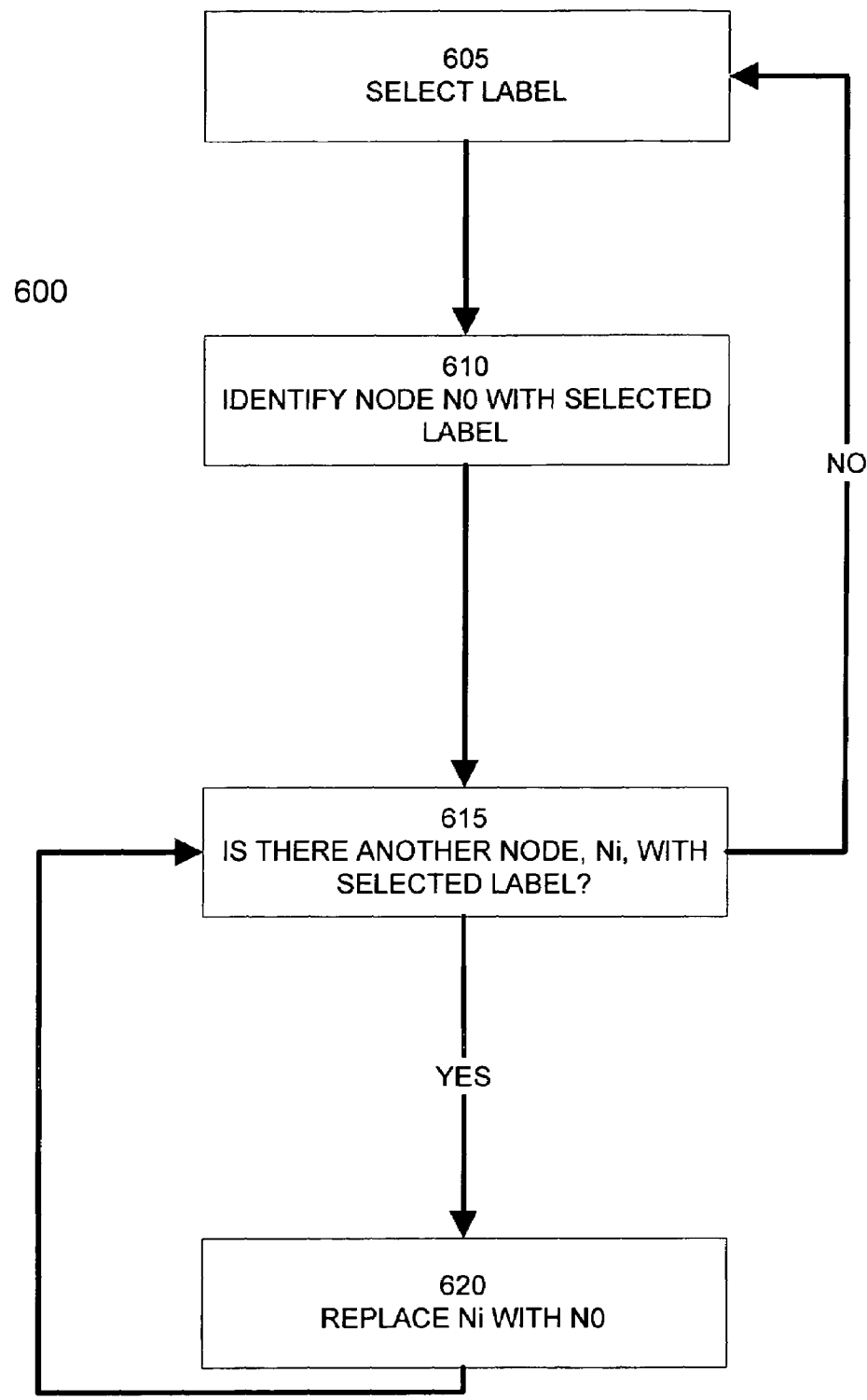
FIG. 6 illustrates a third phase of a method of identifying and removing redundant elements of a digital design according to an embodiment of the invention.

FIG. 6 illustrates a third phase 600 of a method of identifying and removing redundant elements of a digital design according to an embodiment of the invention. Following the completion of phase 400, nodes having identical labels are equivalent to each other. Phase 600 uses the labels associated with the netlist to identify equivalent nodes and remove redundant nodes from the netlist.

Step 605 selects a label associated with the netlist. Step 610 identifies a node N0 associated with the selected label. Step 615 searches the netlist for another node Ni also associated with the selected label. If there is a node Ni with the same label as node N0, step 620 removes node Ni and replaces it with node N0. In an embodiment, step 620 connects every input fed by an output of node Ni with a corresponding output of node N0.

Following step 620, phase 600 returns to step 615 to determine if there are any other nodes Ni in the netlist with the same label as node N0. If so, these nodes Ni are processed by step 620 in a similar manner. If not, then phase 600 returns to step 605 to select another label and its associated labels for evaluation. If all of the labels associated with the netlist have been selected by step 605, phase 600 is complete.

For some types of netlists, it is possible for a node to have the same label as a node in its recursive fan-in. To prevent loops in the network from being introduced in phase 400, an embodiment of phase 600 evaluates nodes in depth-first topological order such that the first node N0 selected in step 610 is the deepest node in the netlist with the selected label. Similarly, an embodiment of phase 400 prevents nodes that have started with a label the same as the ground node and been reassigned another label from being reassigned the label of the ground node.

Figure 5A:
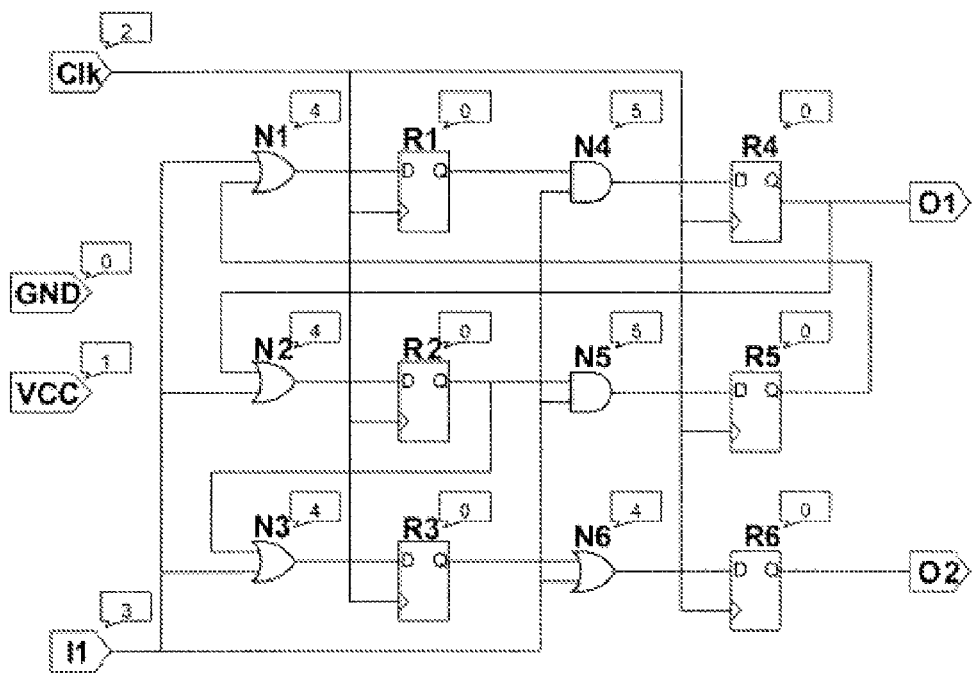
FIGS. 5A-F illustrate an example application of successive iterations of a method of identifying and removing redundant elements of a digital design according to an embodiment of the invention.
Figure 5B:
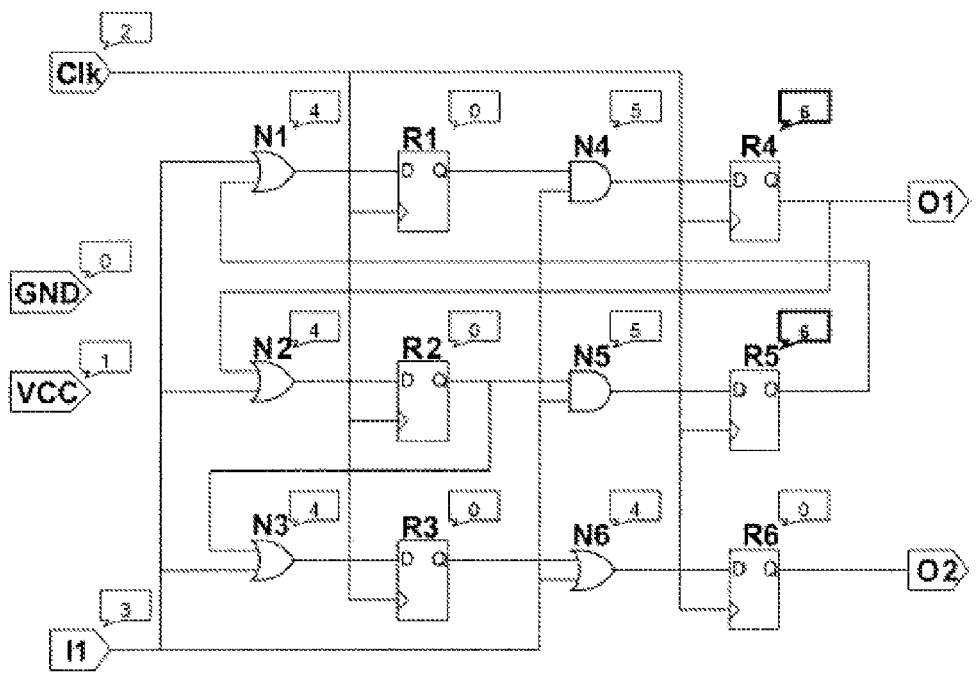
Figure 5C:
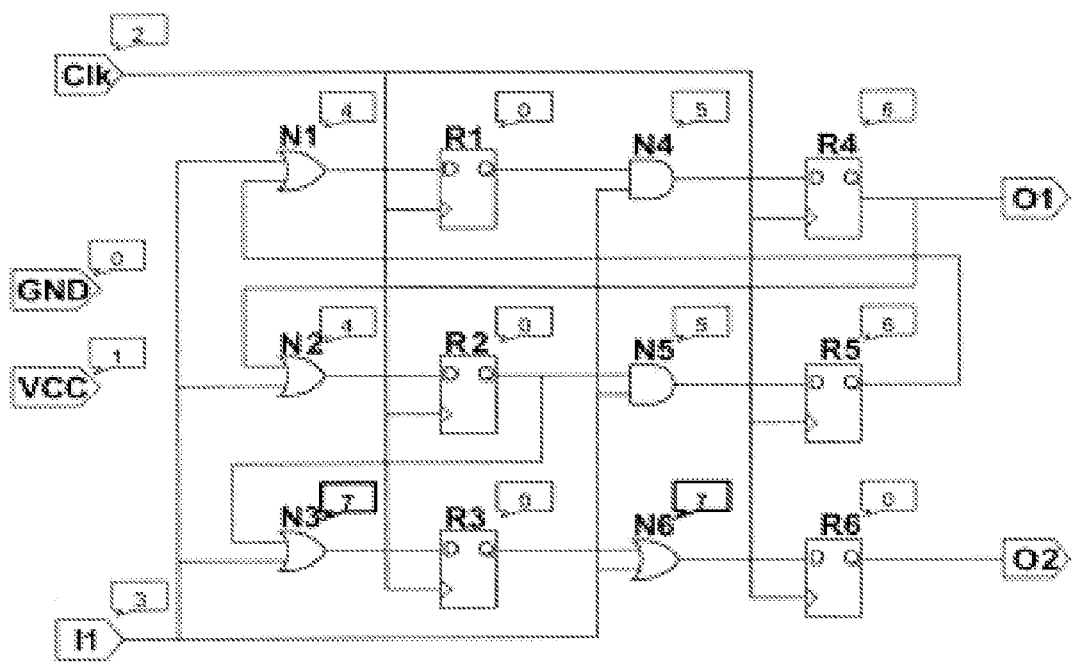
Figure 5D:
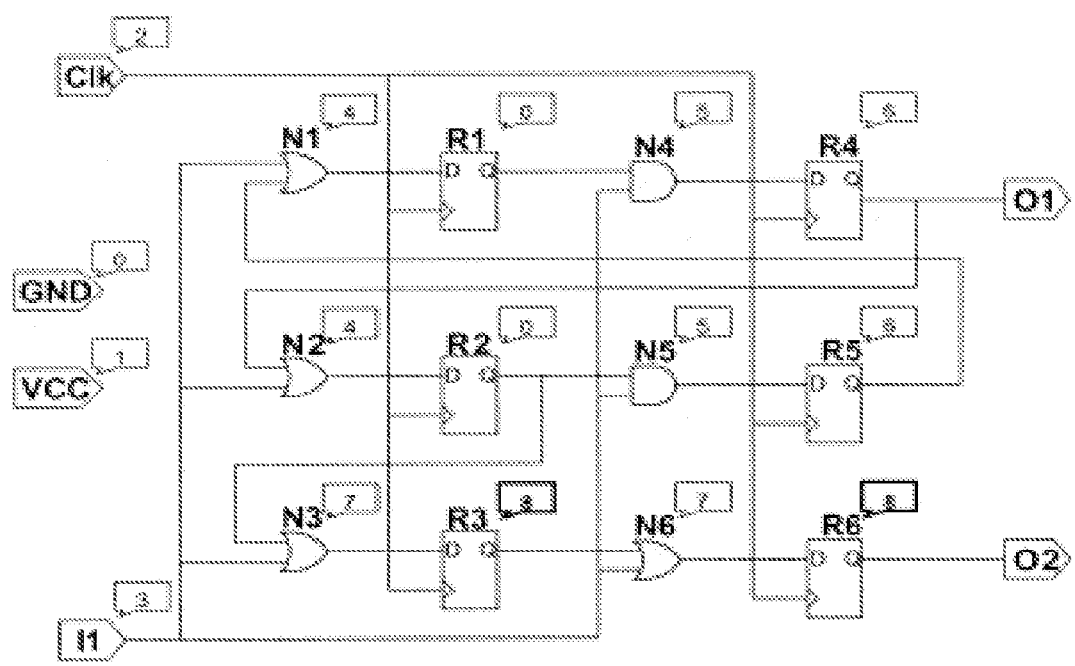
Figure 5E:
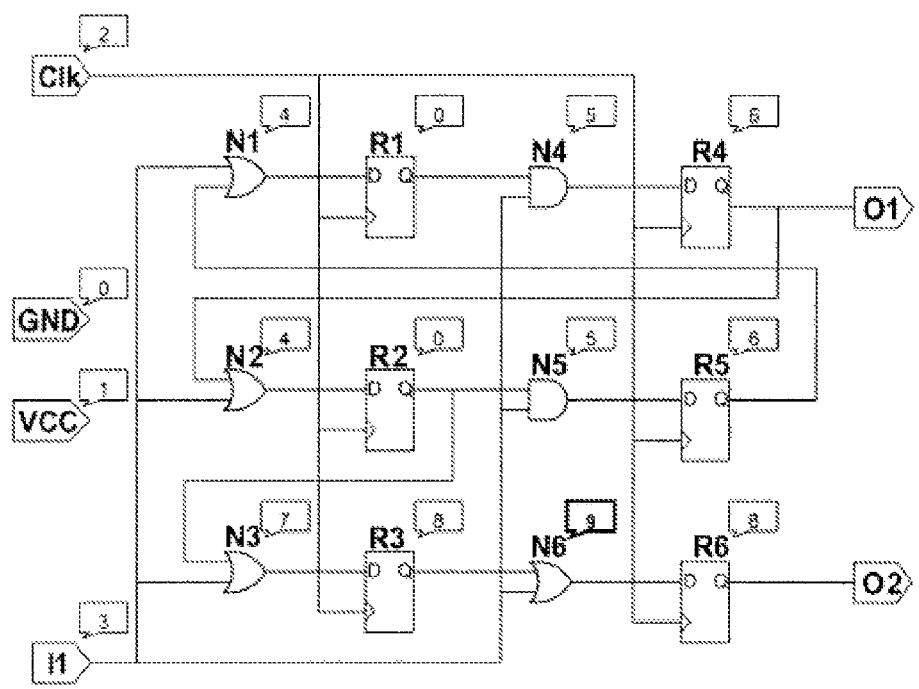
Figure 5F:
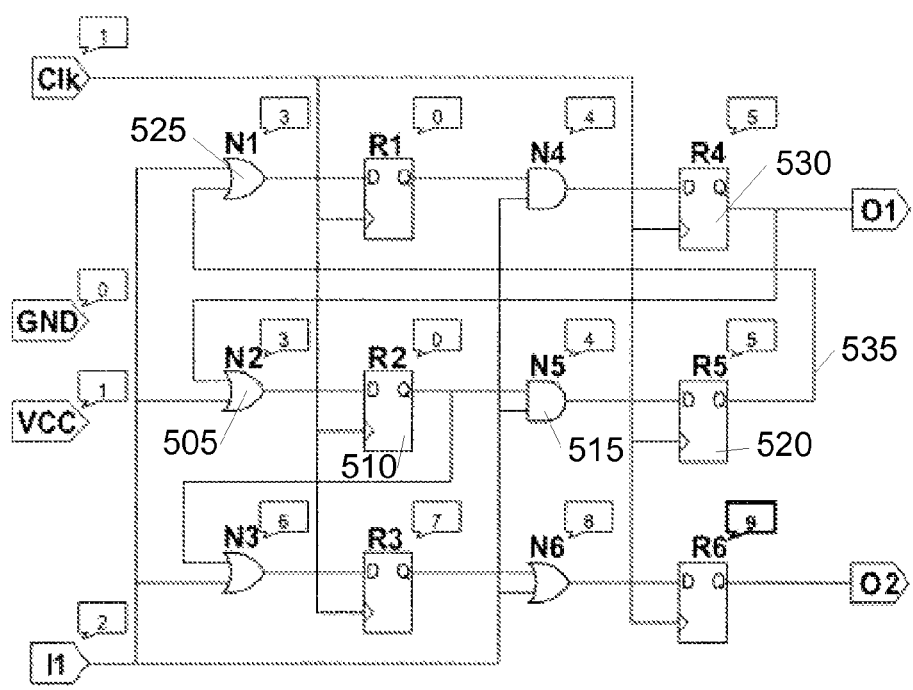
Figure 7:
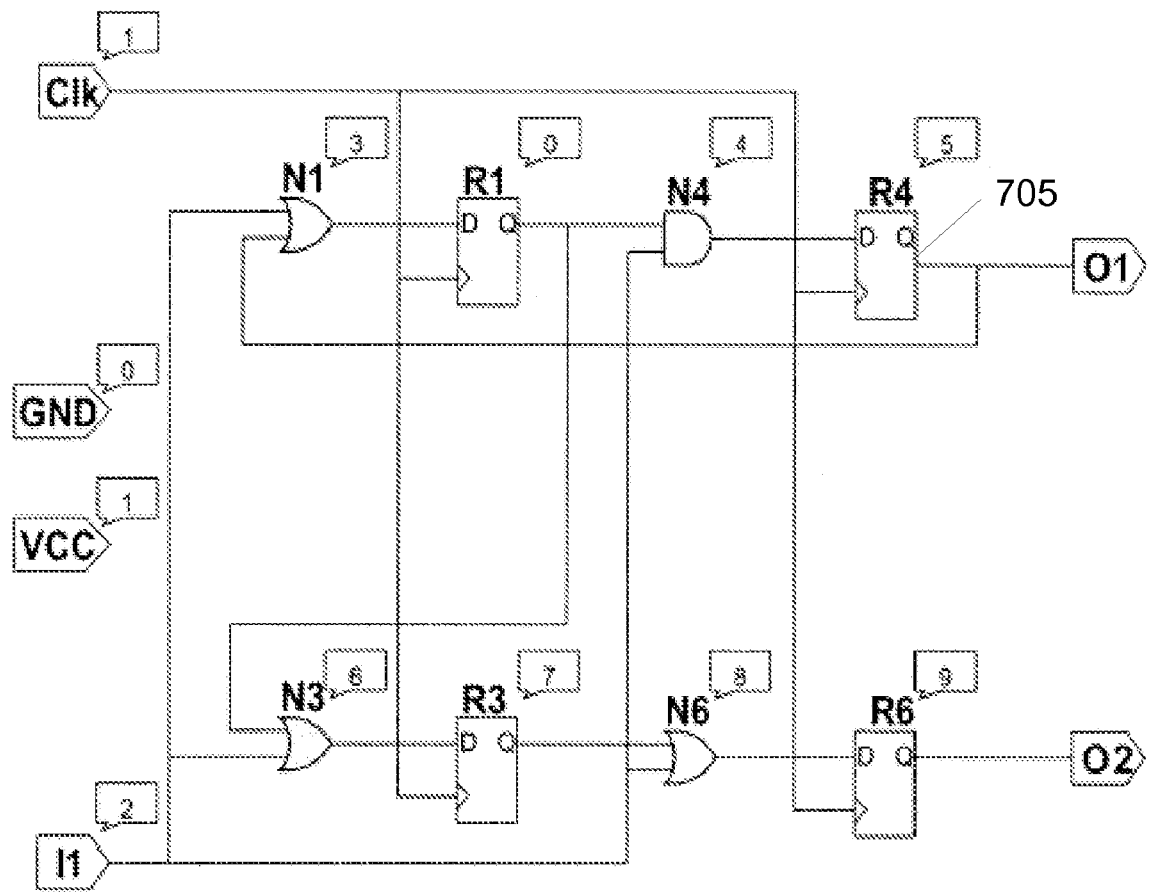
FIG. 7 illustrates an example application of a third phase of a method of identifying and removing redundant elements of a digital design according to an embodiment of the invention.

FIG. 7 illustrates an example application of a third phase of a method of identifying and removing redundant elements of a digital design according to an embodiment of the invention. For comparison, FIG. 5F illustrates the same example netlist before the application of phase 600. Following the application of phase 600 to the example netlist, only nodes with unique labels remain, with the exception of label "0." By comparing FIGS. 5F and 7, it can be seen that nodes 505, 510, 515, and 520 in FIG. 5F were redundant and therefore removed by phase 600. For example, both nodes 505 and 525 in FIG. 5F have the label "4." Therefore, phase 600 can remove node 505 from the netlist. Similarly, node 520 and 530 have the same label "5," so phase 600 can remove node 520. As can be seen by comparing FIGS. 5F and 7, the connection 535 in FIG. 5F between the output of node 520 and the input of node 525 is replaced in FIG. 7 with equivalent connection 705.

Figure 8:
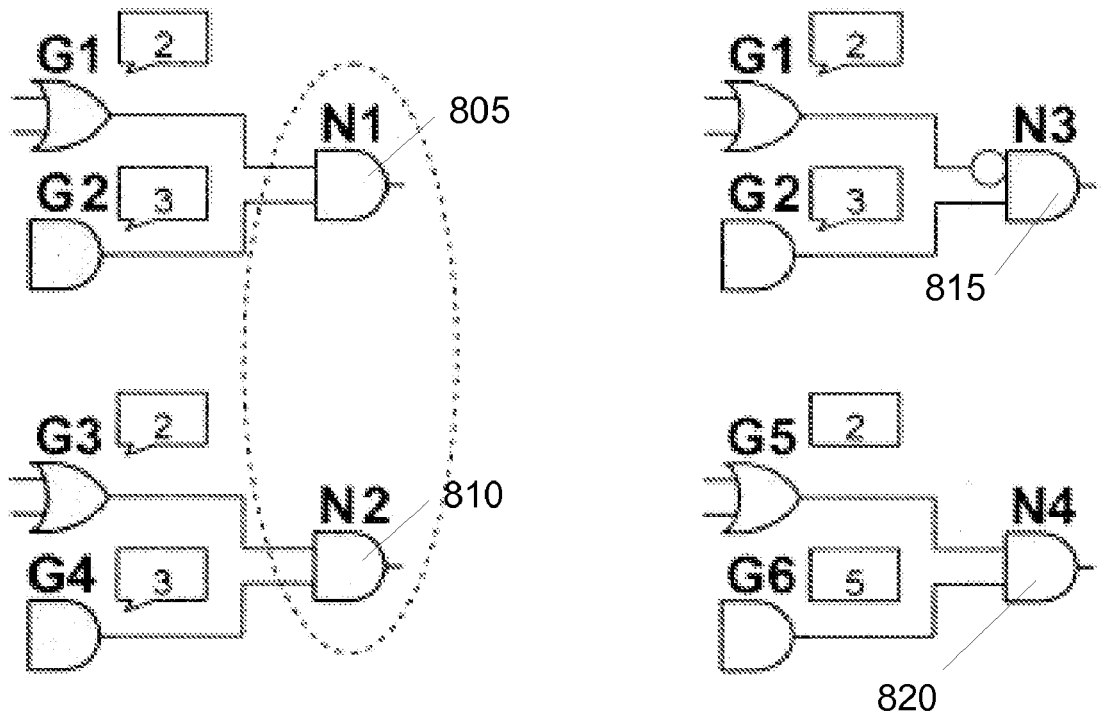
FIG. 8 illustrates an example of equivalent nodes suitable for optimization by an embodiment of the invention.

FIG. 8 illustrates an example of equivalent nodes suitable for optimization by an embodiment of the invention. In FIG. 8, example node N1, 805, is equivalent to node N2, 810, but not to nodes N3, 815, or N4, 820. In this example, node N1, 805, is equivalent to node N2, 810, because it performs the same function on inputs with having the same labels. However, node N1, 805, is not equivalent to N3, 815, because it implements a different function. Node N1, 805, is not equivalent to node N4, 820, because although the functions are the same, each nodes' inputs have different labels.

Figure 9:
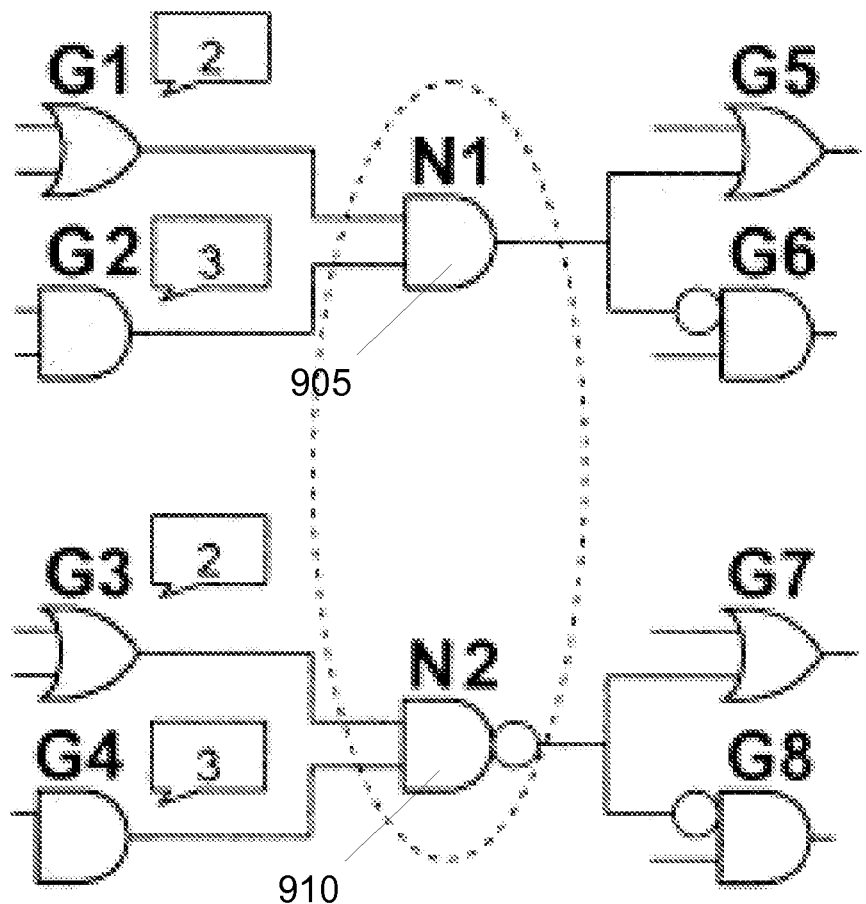
FIG. 9 illustrates an example of equivalent complementary nodes suitable for optimization by an embodiment of the invention.

FIG. 9 illustrates an example of equivalent complementary nodes suitable for optimization by an embodiment of the invention. Node N1, 905, is equivalent, but complementary, to node N2, 910. In determining whether two nodes are complementary equivalents, many tautological equivalents well known in the art can be considered. For example, changing the order of inputs to OR and AND gates doesn't change their function; thus one tautological equivalent is that the inputs of AND and OR can be reordered. Another tautological equivalent is that duplicate inputs to OR and AND gates do not change the output of the gate; thus if multiple inputs with the same polarity are fed by nodes with the same label, all but the first of these inputs can be ignored.

Figure 10:
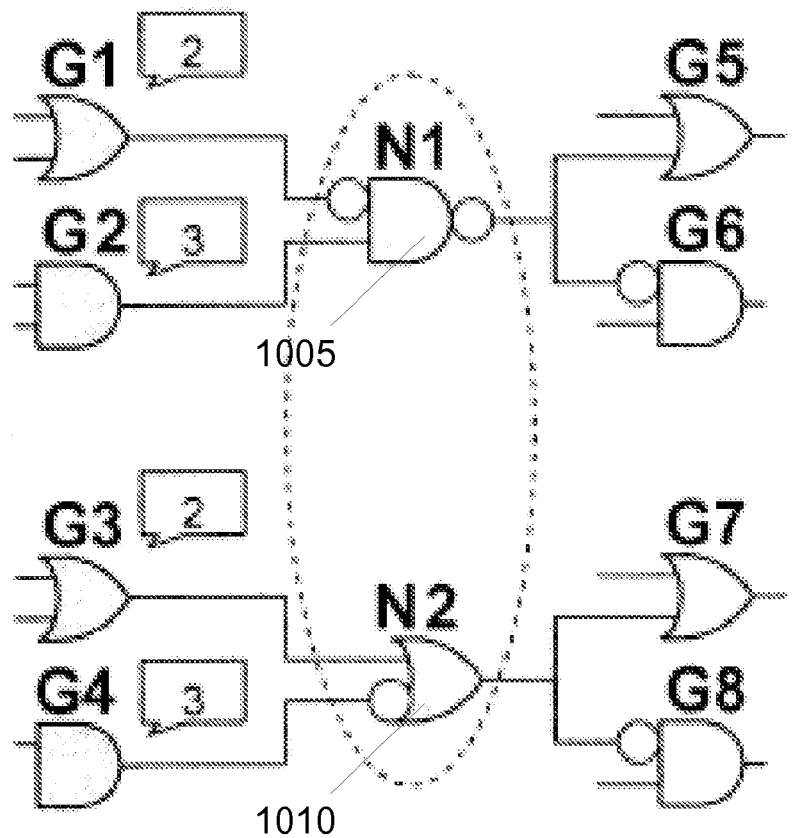
FIG. 10 illustrates an example of tautologically equivalent nodes suitable for optimization by an embodiment of the invention.

FIG. 10 illustrates an example of tautologically equivalent nodes suitable for optimization by an embodiment of the invention. In this example, node N1, 1005, is equivalent to node N2, 1010 because a well-known logical tautology, an application of one of De Morgan's theorems, states that an AND gate is the same as an OR with inverted inputs and output. To facilitate comparisons, logic gates in the netlist can be replaced by functionally equivalent canonical gates, such as converting all "AND" and "OR" gates to "NAND" gates by judiciously inverting the appropriate inputs and outputs of the gate.

Figure 11:
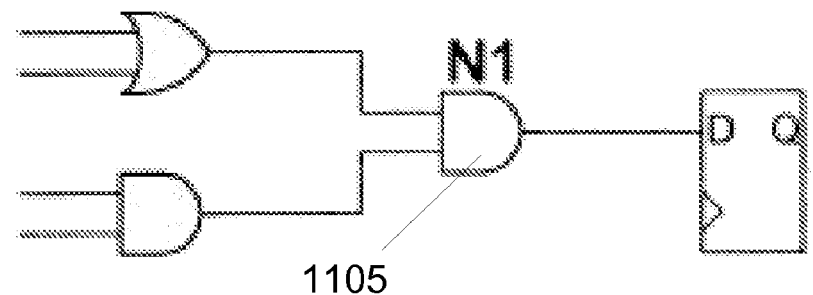
FIG. 11 illustrates an example of a canonical conversion of a node for evaluation by an embodiment of the invention.
Figure 11:
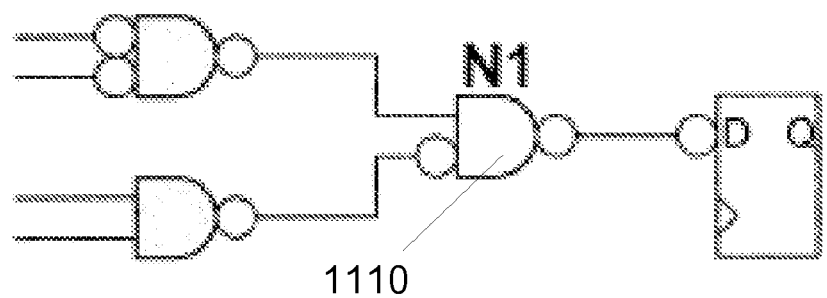

FIG. 11 illustrates an example of a canonical conversion of a node for evaluation by an embodiment of the invention. In the example of FIG. 11, an example netlist 1105 is converted to a canonical format 1110 in which all combinational gates have been converted to NAND gates by inverting appropriate inputs and outputs.

Another example tautology states that two nodes are also considered equivalent if one node logically reduces to a single label that happens to be the label assigned to the second node. For example, if all the inputs to an "AND" or "OR" gate are fed by gates with the same label, then the "AND" or "OR" gate logically reduces to that label and is equivalent to every other gate having the same label.

Figure 12:
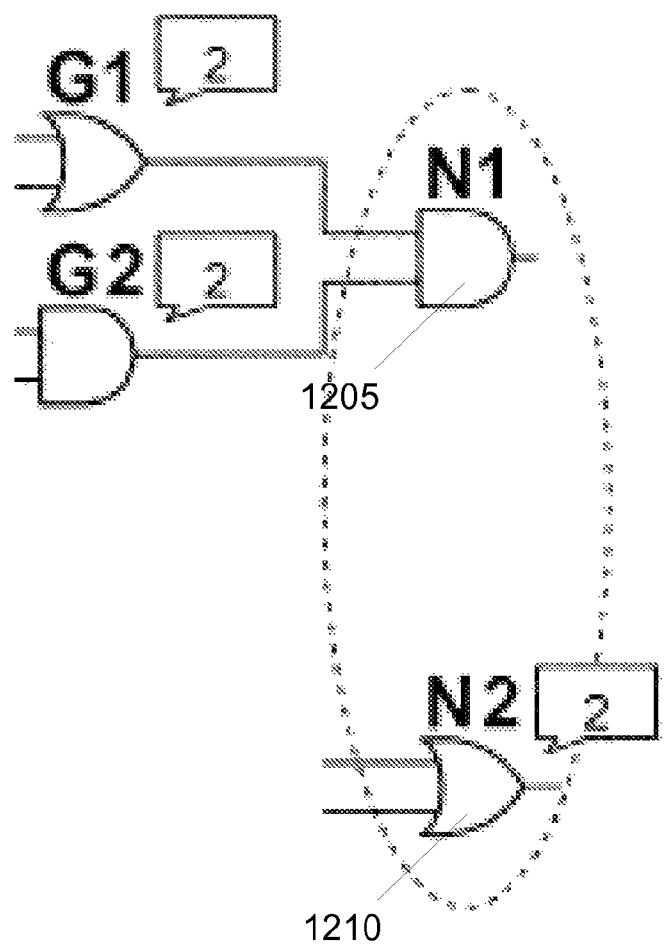
FIG. 12 illustrates an example of a topological reduction of a node for evaluation by an embodiment of the invention.

FIG. 12 illustrates an example of a topological reduction of a node for evaluation by an embodiment of the invention. In FIG. 12, example gate 1205 has been topologically reduced to the labels that feed its inputs. It is therefore equivalent to any node, such as node 1210, with the same label.

In a further example, a node that tautologically reduces to ground is equivalent to the ground node, and a node that tautologically reduces to VCC node is equivalent to the VCC node. For example, if an "OR" gate has a non-inverted input tied to a node with the same label as the VCC node, or has an inverted input tied to a node with the same label as the ground node, or has an inverted and non-inverted input tied to nodes with the same label, it tautologically reduces to VCC. Likewise, if an "AND" gate has a non-inverted input tied to a node with the same label as the ground node, or has an inverted input tied to a node with the same label as the VCC node, or has an inverted and non-inverted input tied to nodes with the same label, it tautologically reduces to ground.

Figure 13:
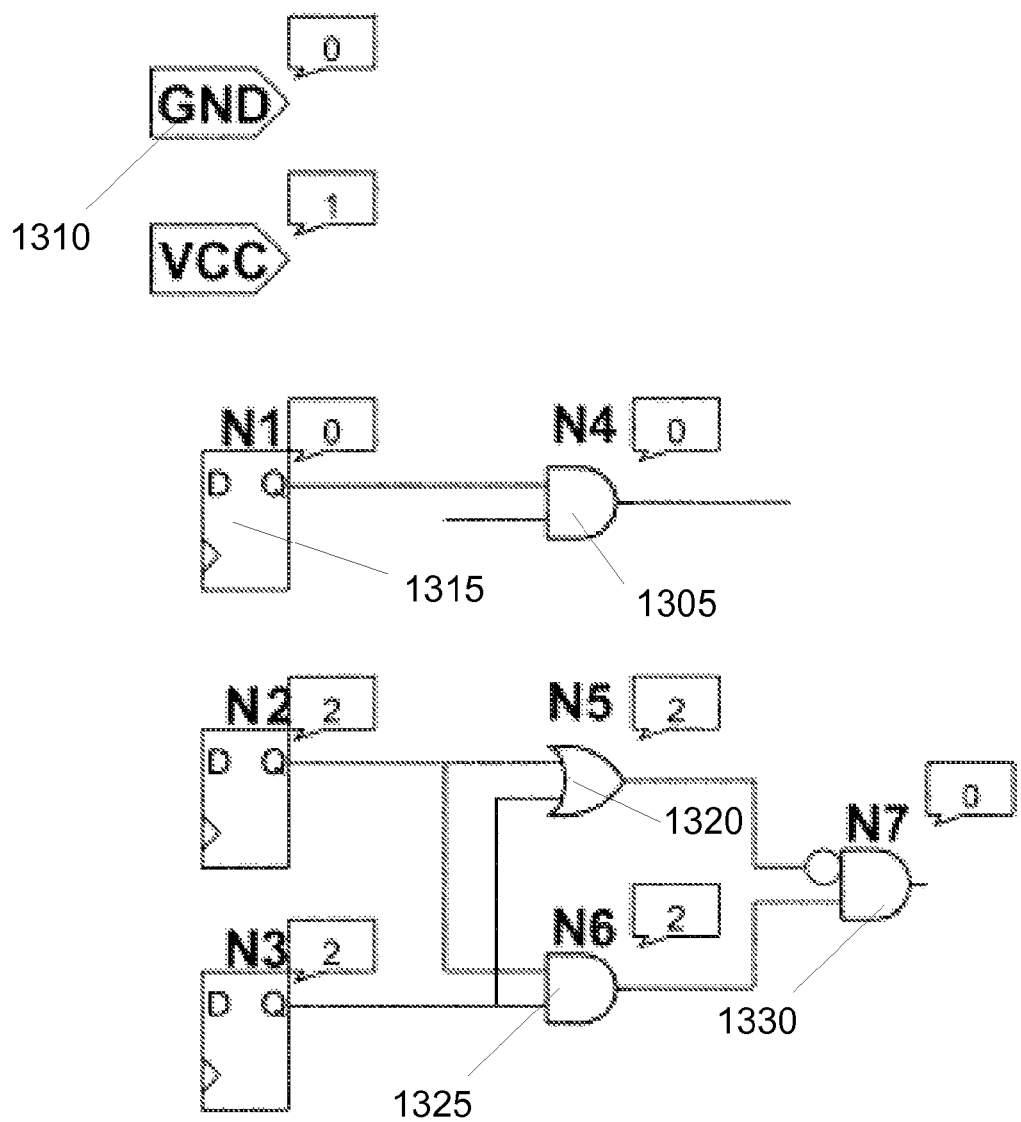
FIG. 13 illustrates an example of a topological reduction of a node for evaluation by an embodiment of the invention.

FIG. 13 illustrates an example of a topological reduction of a node for evaluation by an embodiment of the invention. FIG. 13 illustrates an example of logic gates topologically reducing to ground, and thereby being equivalent to the ground node. AND gate N4, 1305, is labeled with the same label as the "ground" node, 1310, because it has a non-inverted input fed by node N1, 1315, that is has the same label as the "ground" node. Similarly, AND gate N5, 1320, and OR gate N6, 1325, have all their inputs fed by nodes with the same label (label 2) and are therefore given the same label. Thus, AND gate N7, 1330, has both an inverted and non-inverted input tied to nodes that have the same label and will always output a false or ground value. Therefore, node N7, 1330, tautologically reduces to ground and is given the same label as the ground node 1310.

Figure 14:
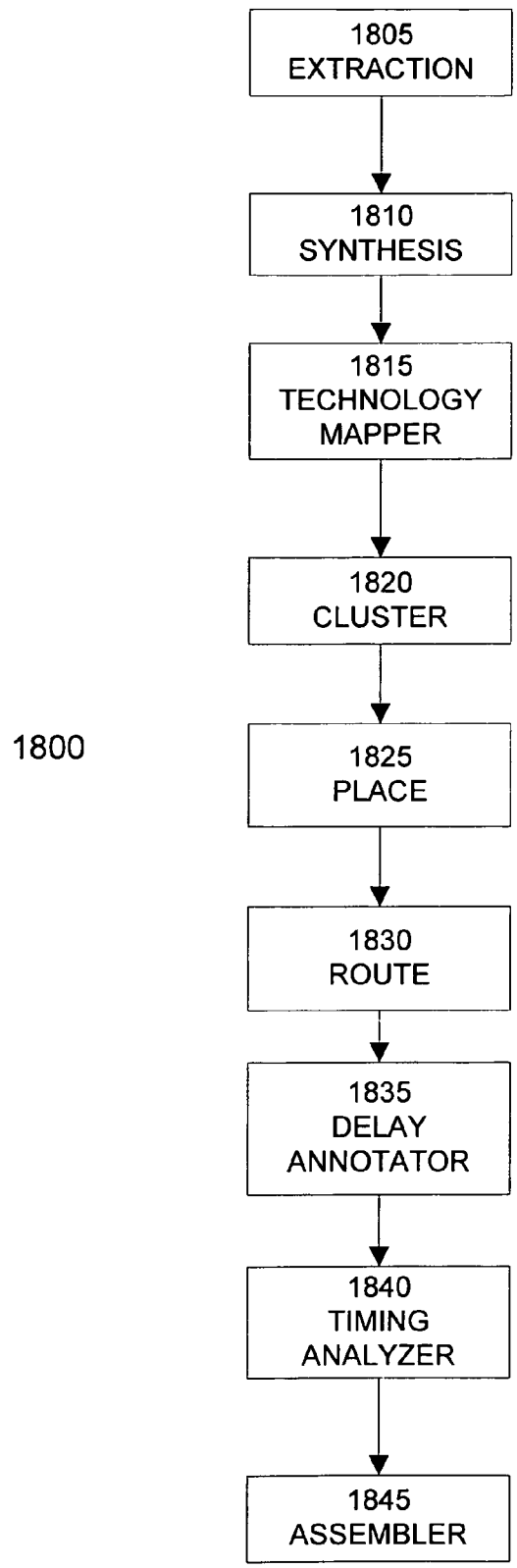
FIG. 14 illustrates an example compilation process suitable for use with an embodiment of the invention.

FIG. 14 illustrates an example compilation process 1800 suitable for implementing an embodiment of the invention. The compilation process 1800 converts a user design into a programmable device configuration adapted to configure a programmable device to implement the user design. The extraction phase 1805 converts a description of the user design, expressed for example in a hardware description language, into a register transfer layer description.

Synthesis phase 1810 converts the register transfer layer description of the user design into a set of logic gates. Technology mapping phase 1815 subdivides the set of logic gates into a set of atoms, which are groups of logic gates matching the capabilities of the logic cells or other functional blocks of the programmable device. A given user design may be converted into any number of different sets of atoms, depending upon the underlying hardware of the programmable device used to implement the user design.

Following the technology mapping phase 1815, the cluster phase 1820 groups related atoms together into clusters. The place phase 1825 assigns clusters of atoms to locations on the programmable device. The route phase 1830 determines the configuration of the configurable switching circuit of the programmable device used to connect the atoms implementing the user design.

The delay annotator phase 1835 determines the signal delays for the set of atoms and their associated connections in the configurable switching circuit using a timing model of the programmable device. The timing analysis phase 1840 determines the maximum operating speed of the programmable device when implementing the user design, for example by determining the portions of the user design have the largest signal delay.

The assembler phase 1845 generates a set of configuration information specifying the configuration of the programmable device implementing the user design, including the configuration of each of the logic cells used to implement the user design and the configuration of the configurable switching circuit used to connect the logic cells. The assembler phase 1845 can write the configuration information to a configuration file, which can then be used to configure one or more programmable devices to implement instances of the user design.

Figure 15:
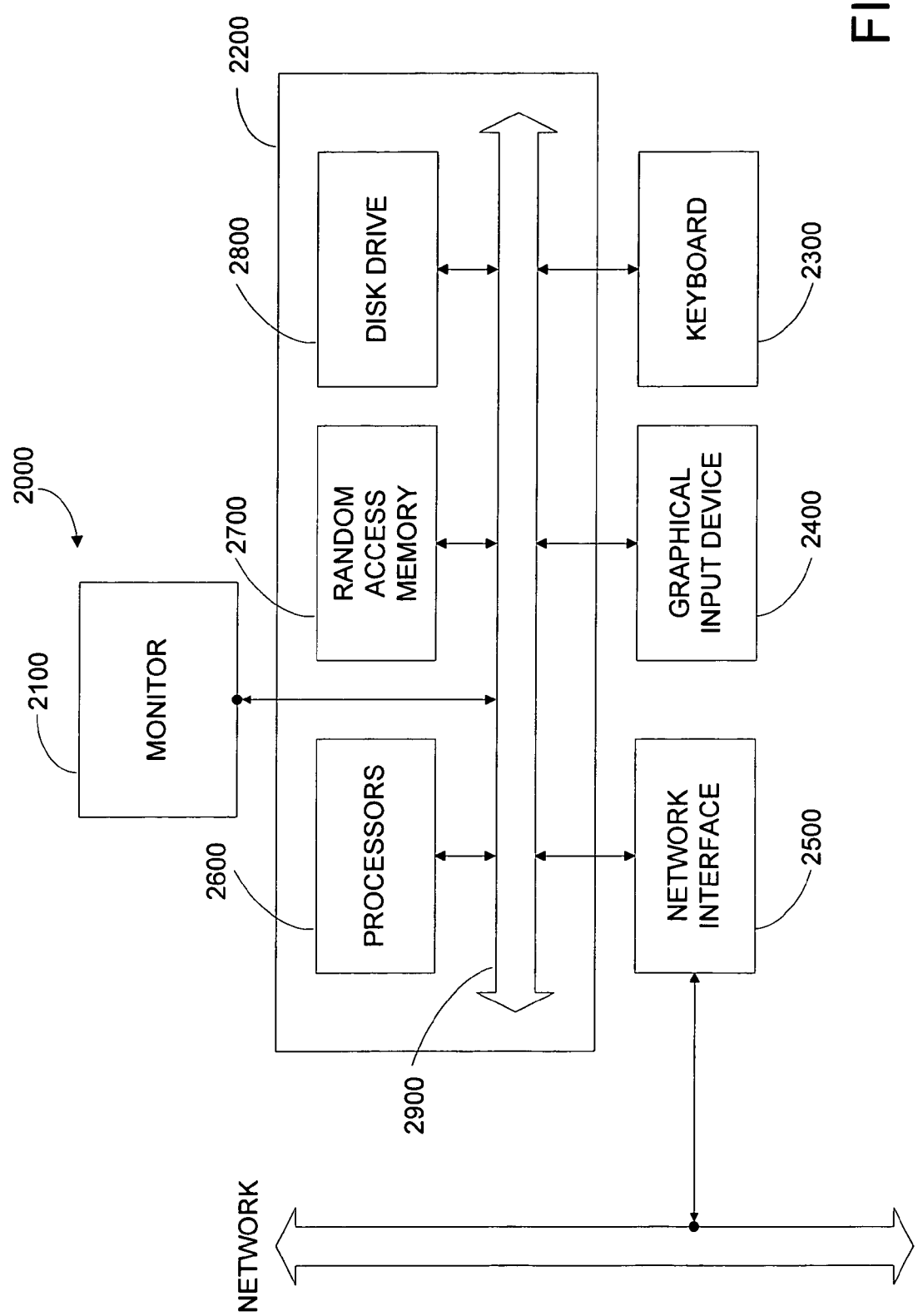
FIG. 15 illustrates an example computer system suitable for executing software implementing an embodiment of the invention.

FIG. 15 illustrates a computer system 2000 suitable for implementing an embodiment of the invention. Computer system 2000 typically includes a monitor 2100, computer 2200, a keyboard 2300, a user input device 2400, and a network interface 2500. User input device 2400 includes a computer mouse, a trackball, a track pad, graphics tablet, touch screen, and/or other wired or wireless input devices that allow a user to create or select graphics, objects, icons, and/or text appearing on the monitor 2100. Embodiments of network interface 2500 typically provides wired or wireless communication with an electronic communications network, such as a local area network, a wide area network, for example the Internet, and/or virtual networks, for example a virtual private network (VPN).

Computer 2200 typically includes components such as one or more general purpose processors 2600, and memory storage devices, such as a random access memory (RAM) 2700, disk drives 2800, and system bus 2900 interconnecting the above components. RAM 2700 and disk drive 2800 are examples of tangible media for storage of data, audio/video files, computer programs, applet interpreters or compilers, virtual machines, and embodiments of the herein described invention. Further embodiments of computer 2200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Further embodiments can be envisioned to one of ordinary skill in the art after reading the attached documents. For example, although the invention has been discussed with reference to programmable devices, it is equally applicable to logic minimization applications used to design any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method for removing redundant nodes in a digital design, the method comprising:
    labeling a plurality of nodes, relabeling the plurality of nodes, removing redundant nodes, and implementing the resulting digital design on an integrated circuit, wherein:
    relabeling the plurality of nodes comprises:
    for each of the plurality of labels:
    selecting a label;
    selecting a first node having the label;
    selecting a second node having the label; and
    for each node after the first node and up to and including the second node:
    finding an equivalent node to the second node, and if the equivalent node is not the second node, then changing the label of the second node to be the same as the label of the equivalent node, otherwise if the equivalent node is the second node, then changing the label of the second node to an unused label.

2. The method of claim 1 wherein the plurality of nodes in the digital design comprises:
    a plurality of logic gates;
    a plurality of registers;
    at least one primary input;
    a power supply; and
    a ground supply.

3. The method of claim 2 wherein providing a plurality of labels for the plurality of nodes comprises:
    assigning a first label to the ground supply;
    assigning a second label to the power supply;
    selecting an unlabeled node of the digital design;
    determining if the selected node is a primary input; and
    assigning an unused label to the selected node in response to a determination that the selected node is a primary input; otherwise
    assigning the first label to the selected node.

4. The method of claim 1 wherein a node is equivalent to the second node if it performs the same or complementary function on one or more input nodes assigned to the same labels.

5. The method of claim 1 wherein removing redundant nodes comprises:
    selecting a label;
    identifying a third node assigned to the label;
    identifying a fourth node assigned to the label; and
    replacing the fourth node with the third node.

6. The method of claim 5 wherein replacing the fourth node with the third node comprises:
    identifying a fifth node connected with an output of the fourth node;
    removing the fourth node from the digital design; and
    connecting the fifth node with a corresponding output of the third node.

7. A method for removing redundant nodes in a digital design, the method comprising:
    providing labels for a plurality of nodes in the digital design;
    replacing the labels for some of the plurality of nodes in the digital design by:
    selecting a label;
    selecting a first node having the selected label; and
    for each node beginning with a second node, the second node after the first node, and ending at a third node, the third node having the selected label, determining if the node is equivalent to the third node, and if the node is equivalent to the third node and is not the third node, then changing the label of the third node to be the same as the node, otherwise changing the label of the third node to an unused label;
    removing redundant nodes from the digital design; and
    implementing the resulting digital design on an integrated circuit.

8. The method of claim 7 wherein the plurality of nodes in the digital design comprises:
    a plurality of logic gates;
    a plurality of registers;
    a power supply;
    a ground supply; and
    at least one primary input, a primary input being an input not provided by another node.

9. The method of claim 8 wherein providing a plurality of labels for the plurality of nodes comprises:
    assigning a first label to the ground supply;
    assigning a second label to the power supply;
    selecting an unlabeled node of the digital design;
    determining if the selected node is a primary input; and
    assigning an unused label to the selected node in response to a determination that the selected node is a primary input; otherwise
    assigning the first label to the selected node.

10. The method of claim 7 wherein a node is equivalent to the second node if it performs the same or complementary function on one or more input nodes assigned to the same labels.

11. The method of claim 7 wherein removing redundant nodes comprises:
    selecting a label;
    identifying a fourth node assigned to the label;
    identifying a fifth node assigned to the label; and
    replacing the fifth node with the fourth node.

12. The method of claim 11 wherein replacing the fifth node with the fourth node comprises:
    identifying a sixth node connected with an output of the fifth node;
    removing the fifth node from the digital design; and
    connecting the sixth node with a corresponding output of the fourth node.

13. A method for removing redundant nodes in a digital design, the method comprising:
    assigning labels to nodes of a digital design;
    selecting at least one label;
    identifying a first node of the digital design assigned to the selected label;
    identifying at least one additional node of the digital design assigned to the selected label;
    identifying at least one equivalent node of the digital design, wherein the equivalent node is logically equivalent to the additional node;
    determining if the equivalent node is the same as the first node;
    reassigning labels of at least the additional node in response to a determination that the equivalent node is not the same as the first node;
    removing redundant nodes from the digital design; and implementing the resulting digital design on an integrated circuit.

14. The method of claim 13 further comprising:
determining if the additional node and the equivalent node are complements; and
modifying at least the additional node or the equivalent node in response to a determination that the additional node and the equivalent node are complements.

15. The method of claim 14 wherein a node is logically equivalent to the additional node if they perform the same or complementary functions on one or more input nodes assigned to the same labels.

16. The method of claim 15 wherein identifying at least one equivalent node includes:
identifying a function of the additional node;
identifying a function of each of at least a portion of the nodes of the digital design; and
comparing the function of the additional node with the function of each of at least the portion of the nodes of the digital design.

17. The method of claim 13 wherein reassigning labels of at least the additional node further comprises:
determining if the equivalent node is the same as the additional node;
assigning the label associated with the equivalent node to the additional node in response to a determination that the equivalent node is not the same as the additional node; and
assigning an unused label to the additional node in response to a determination that the equivalent node is the same as the additional node.

18. The method of claim 14 wherein modifying at least the additional node or the equivalent node in response to a determination that the additional node and the equivalent node are complements comprises:
inverting a function of the additional node;
identifying nodes of the digital design connected with an output of the additional node; and
inverting inputs of the identified nodes connected with the output of the additional node.

19. The method of claim 13 wherein assigning labels to the nodes of the digital design comprises:
assigning a first label to a ground node;
assigning a second label to a voltage supply node;
selecting an unlabeled node of the digital design;
determining if the selected node is a primary input;
assigning an unused label to the selected node in response to a determination that the selected node is a primary input; and
assigning the first label to the selected node in response to a determination that the selected node is not a primary input.

20. The method of claim 13 further comprising:
selecting a label;
identifying a first node assigned to the label;
identifying an additional node assigned to the label; and
replacing the additional node with the first node.

21. The method of claim 20 wherein replacing the additional node with the first node comprises:
identifying a node connected with an output of the additional node;
removing the additional node from the digital design; and
connecting the node with a corresponding output of the first node.

* * * * *